US012801030B2

(12) United States Patent
Gao et al.

(10) Patent No.: US 12,801,030 B2
(45) Date of Patent: Nov. 17, 2026

(54) METHOD FOR FULL-CHIP QUICK SIMULATION OF NEGATIVE TONE DEVELOPMENT PHOTOLITHOGRAPHY PROCESS, NEGATIVE TONE DEVELOPMENT PHOTORESIST MODEL, OPC MODEL, AND ELECTRONIC DEVICE

(71) Applicant: DONGFANG JINGYUAN ELECTRON CO., LTD., Beijing (CN)

(72) Inventors: Shijia Gao, Shenzhen (CN); Li Xie, Shenzhen (CN)

(73) Assignee: DONGFANG JINGYUAN ELECTRON CO., LTD., Beijing (CN)

( * ) Notice: Subject to any disclaimer, the term of this patent is extended or adjusted under 35 U.S.C. 154(b) by 821 days.

(21) Appl. No.: 18/305,350

(22) Filed: Apr. 23, 2023

(65) Prior Publication Data

US 2023/0384692 A1 Nov. 30, 2023

Related U.S. Application Data

(63) Continuation of application No. PCT/CN2020/133696, filed on Dec. 3, 2020.

(30) Foreign Application Priority Data

Oct. 23, 2020 (CN) ......................... 202011153654.X

(51) Int. Cl.
*G03F 1/36* (2012.01)
*G03F 1/70* (2012.01)
*G03F 7/00* (2006.01)

(52) U.S. Cl.
CPC ............ *G03F 7/70504* (2023.05); *G03F 1/70* (2013.01); *G03F 7/0002* (2013.01); *G03F 7/70625* (2013.01)

(58) Field of Classification Search
CPC ...... G03F 7/70504; G03F 1/70; G03F 7/0002; G03F 7/70625; G03F 1/36; G03F 7/705; G06F 30/20; G06F 17/13; G06F 2119/14
See application file for complete search history.

(56) References Cited

U.S. PATENT DOCUMENTS 10,386,718 B2 * 8/2019 Wu ....................... G03F 7/0045
2011/0224963 A1 * 9/2011 Isoyan .................... G03F 7/705 703/14

(Continued)

FOREIGN PATENT DOCUMENTS

CN 101738848 A 6/2010
CN 107844644 A 3/2018

(Continued)

OTHER PUBLICATIONS

Sean Dominic D'Silva, FEM Modeling of Shrinkage Effects in Negative Tone Photoresist, Master's Thesis, Jun. 29, 2017, pp. 1-76. (Year: 2017).*

(Continued)

*Primary Examiner* — Nghia M Doan
(74) *Attorney, Agent, or Firm* — Andrew C. Cheng

(57) ABSTRACT

The method for full-chip quick simulation of negative tone development photolithography process, analyze the elastic deformation of the photoresist based on elastic mechanics, sets one of the stress and strain variables as an equivalent of a deformation of the photoresist, to obtain an equivalent equation, performs an approximate calculation of the equivalent equation using a Taylor expansion formula to obtain an approximate value of stress or strain, and adjusts the light field distribution according to the approximate value to obtain an appropriate acid concentration distribution, which can make the exposed image closest to a target image. It can effectively analyze the deformation of the photoresist during the thermal shrinkage effect process and (Continued)

improve the accuracy of the lithography calculation process. At the same time, the Taylor expansion is used to fit the thermal shrinkage effect, which can improve the calculation speed.

8 Claims, 10 Drawing Sheets

(56) References Cited

U.S. PATENT DOCUMENTS

| | | | | |
|---|---|---|---|---|
| 2015/0241783 | A1 | 8/2015 | Carcasi | |
| 2016/0140278 | A1 * | 5/2016 | Deng | G06F 30/20 716/54 |
| 2017/0192357 | A1 | 7/2017 | Careasl | |
| 2019/0370423 | A1 | 12/2019 | Huang | |
| 2020/0320238 | A1 | 10/2020 | Batistakis | |

FOREIGN PATENT DOCUMENTS

| | | | |
|---|---|---|---|
| CN | 109558610 | A | 4/2019 |
| CN | 111433680 | A | 7/2020 |
| EP | 3690681 | A1 | 8/2020 |
| JP | 2017507371 | A | 3/2017 |
| JP | 2020197727 | A | 12/2020 |
| KR | 20160124807 | A | 10/2016 |
| TW | 201539539 | A | 10/2015 |
| TW | 201928513 | A | 7/2019 |
| WO | 2015127459 | A1 | 8/2015 |
| WO | 2019062727 | A1 | 4/2019 |
| WO | 2019110403 | A1 | 6/2019 |

OTHER PUBLICATIONS

Pistor et al., Photoresist Shrinkage Effects at EUV, SPIE, 2011, pp. 1-13. (Year: 2011).*

* cited by examiner

METHOD FOR FULL-CHIP QUICK SIMULATION OF NEGATIVE TONE DEVELOPMENT PHOTOLITHOGRAPHY PROCESS, NEGATIVE TONE DEVELOPMENT PHOTORESIST MODEL, OPC MODEL, AND ELECTRONIC DEVICE

CROSS-REFERENCE TO RELATED APPLICATIONS

This application claims priority to Chinese Patent Application No. 202011153654.X, disclosure of which is hereby incorporated by reference in its entireties.

TECHNICAL FIELD

The present disclosure is related to integrated circuit photolithography technology, and especially related to a method for full-chip quick simulation of negative tone development photolithography process, a negative tone development photoresist model, an OPC model, and an electronic device.

BACKGROUND OF THE INVENTION

Lithography is the most important manufacturing process in modern large-scale integrated circuit manufacturing, which involves transferring the design patterns of integrated circuits on masks to silicon wafers through lithography machines. As a size of features gradually decrease, the process window available for manufacturing becomes smaller and smaller. The entire lithography process requires precise control, and the demand for accuracy of calculating lithography is also increasing. Accurate calculation of a lithography models is a theoretical exploration of ways to increase lithography resolution and process window, guiding optimization of process parameters.

At present, the most advanced photoresist technology is negative development technology, which differs from forward development technology in the modeling process. In forward development technology, deformation of photoresist mainly depends on distribution of acid in the photoresist after a light reaction, that is, distribution of the light field. Since an imaging optical simulation process of photolithography can be accurately calculated based on physical imaging models, it is easy to obtain more accurate results for modeling forward development photoresists. However, in negative development photoresists, due to the thermal shrinkage effect of the photoresist during a post drying process, the photoresist generates additional deformation beyond the light field distribution, which is difficult to capture. This effect is crucial for modeling negative developing photoresists. For a full-chip, the maximum size of the chip can reach 32 mm*26 mm, with a minimum pattern having a linewidth of only 10 nm and a layout file of several hundred GB per lithography layer. Therefore, model speed is a crucial technical indicator. Therefore, a model that takes into account both accuracy and speed is needed to simulate the negative tone development photoresist.

SUMMARY OF THE INVENTION

To overcome the technical problem of poor accuracy and low optimization speed in simulating negative tone development photoresist in existing lithography technologies, the present disclosure provides a method for full-chip quick simulation of negative tone development photolithography process, a negative tone development photoresist model, an OPC model, and an electronic device.

In order to solve above-mentioned technological problems, the present disclosure provides a method for full-chip quick simulation of negative tone development photolithography process, which includes following steps: S1, obtaining light field distribution of photoresist based on an optical model, setting the light field distribution to be E(x, y), and setting acid concentration distribution in the photoresist as a function of the light field distribution, which is S(x,y)=F(E(x,y)); S2, setting a thermal shrinkage effect of the photoresist in a post exposure process as an elastic deformation, and analyzing the elastic deformation of the photoresist based on elastic mechanics, setting one of the stress and strain variables is set as an equivalent of a deformation of the photoresist, to obtain an equivalent equation, which is a differential equation; and S3, performing an approximate calculation of the equivalent equation using a Taylor expansion formula to obtain an approximate value of stress or strain, and adjusting the light field distribution according to the approximate value to obtain an appropriate acid concentration distribution.

Preferably, according to assumption of continuity, an elastic body remains continuous before and after deformation, assuming that a point in an elastic body moves from M(x, y, z) to M'(x', y', z') during deformation, this process is a continuous process, and all displacements satisfy the equation:

$$\{f\} = \begin{Bmatrix} u(x, y, z) \\ v(x, y, z) \\ w(x, y, z) \end{Bmatrix}$$

wherein, u(x, y, z)=x'(x, y, z)−x, v(x, y, z)=y'(x, y, z)−y, w(x, y, z)=w'(x, y, z)−w, wherein, u, v, w correspond to displacement on x direction, y direction and z direction, respectively, the photoresist is considered as an elastic body.

In step S2, obtaining of the equivalent equation includes following steps: S21, corelating external forces with stress through equilibrium equations, correlating stress with strain through physical equations, and correlating strain with displacement through geometric equations; and S22, simplifying the equilibrium equations, the physical equations, and the geometric equations based on setting the photoresist as a flat surface due to a small thickness of the photoresist.

Preferably, the equivalent equation corresponding to a correlation formula between the strain and the displacement is obtained based on simplified geometric equations.

Preferably, the symbols in following equations are consistent with definition in elastic mechanics, they will not be defined one by one here; in step S22, the photoresist is considered to be a flat surface, $\sigma_z=0$, $\tau_{zx}=0$, $\tau_{zy}=0$, w=0; the stress component is:

$$\{\sigma\} = \begin{Bmatrix} \sigma_x \\ \sigma_y \\ \tau_{xy} \end{Bmatrix}$$

the stain component is:

$$\{\varepsilon\} = \begin{Bmatrix} \varepsilon_x \\ \varepsilon_y \\ \gamma_{xy} \end{Bmatrix}$$

the equilibrium equations are simplified as follow:

$$\frac{\partial \sigma_x}{x} + \frac{\partial \tau_{yx}}{y} + X = 0$$

$$\frac{\partial \tau_{xy}}{x} + \frac{\partial \sigma_y}{y} + Y = 0$$

the geometric equations are simplified as follow:

$$a = \frac{\partial u}{\partial x}$$

$$\varepsilon_y = \frac{\partial v}{\partial y}$$

$$Y_{xy} = \frac{\partial v}{\partial x} + \frac{\partial u}{\partial y}.$$

Preferably, the equivalent equation is:

$$\varepsilon = \sqrt{\varepsilon_x^2 + \varepsilon_y^2} = \sqrt{\frac{\partial u^2}{\partial x} + \frac{\partial v^2}{\partial y}}.$$

a Taylor expansion formula similar with the equivalent equation is:

$$S(x_0 + h, y_0 + k) = S(x_0, y_0) + \left(h\frac{\partial}{\partial x} + k\frac{\partial}{\partial y}\right)S(x_0, y_0) + \frac{1}{2!}\left(h\frac{\partial}{\partial x} + k\frac{\partial}{\partial y}\right)S(x_0, y_0)^2 + \ldots + \frac{1}{n!}\left(h\frac{\partial}{\partial x} + k\frac{\partial}{\partial y}\right)^n S(x_0, y_0) + R_n R_n = \frac{1}{(n+1)!}\left(h\frac{\partial}{\partial x} + k\frac{\partial}{\partial y}\right)^{n+1} S(x_0 + \theta h, y_0 + \theta k).$$

Wherein, $(0<\theta<1)$, h and k are constant.

In order to solve above-mentioned technological problems, the present disclosure further provides an electronic device, which includes one or more processors, a storage device configured to storing one or more programs, when the one or more programs is executed by the one or more processors, the one or more processors are caused to perform the method.

Comparing with existing technologies, analyzing the elastic deformation of the photoresist based on elastic mechanics, setting one of the stress and strain variables is set as an equivalent of a deformation of the photoresist, to obtain an equivalent equation, which is a differential equation; and performing an approximate calculation of the equivalent equation using a Taylor expansion formula to obtain an approximate value of stress or strain, and adjusting the light field distribution according to the approximate value to obtain an appropriate acid concentration distribution, which can make the exposed image closest to a target image. It can effectively analyze the deformation of the photoresist during the thermal shrinkage effect process and improve the accuracy of the lithography calculation process. At the same time, the Taylor expansion is used to fit the thermal shrinkage effect, which can improve the calculation speed. Therefore, the problem of complex calculation in the full-chip negative development lithography process is solved.

Since the photoresist has a relatively small thickness, the photoresist can be considered as a flat surface, which facilitate simplifying the equilibrium equations, the physical equations, and the geometric equations. Simplified equivalent equation and Taylor expansion have significant similarities, so there is no need to solve the equivalent equation differentially, which can greatly improve the calculation speed and ensure accuracy.

The negative tone development photoresist model, the OPC model and the electronic device provided by the present disclosure has the same technological effects with above mentioned technological effects.

DETAILED DESCRIPTION OF THE INVENTION

In order to make the objects, technical solutions and advantages of the invention clearer, the invention will be further described in detail in combination with the drawings and the embodiments. It should be understood that the embodiments described herein are only used to explain the invention and are not used to limit the invention.

Figure 1:
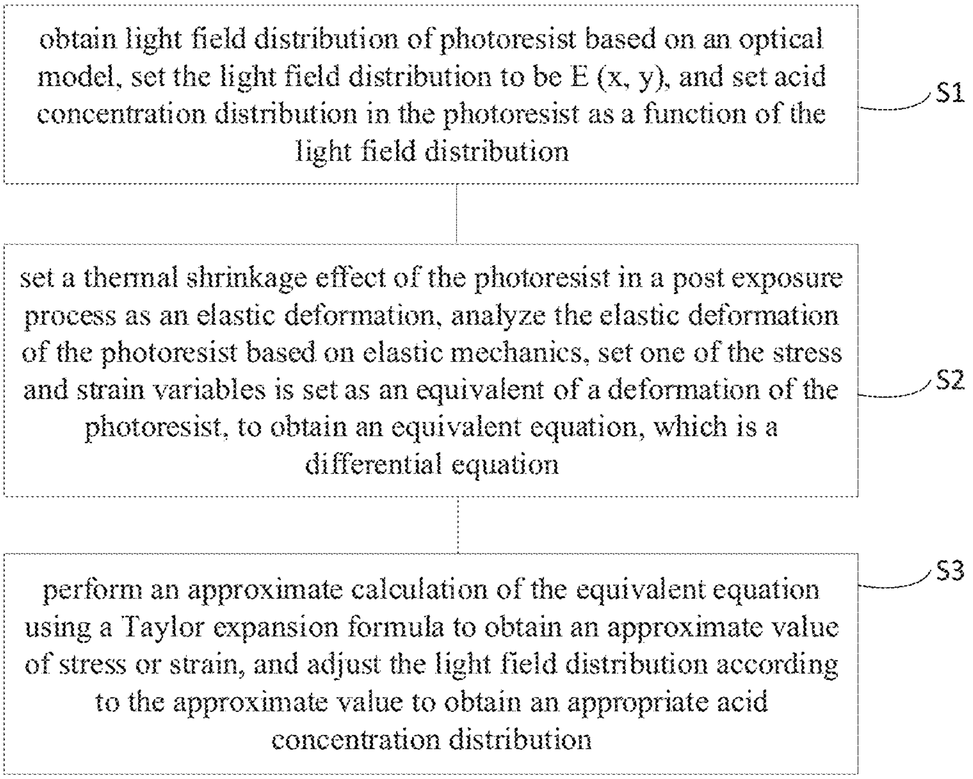
FIG. 1 is a flow chart of a method for full-chip quick simulation of negative tone development photolithography process according to a first embodiment of the present disclosure.

Referring to FIG. 1, a first embodiment of the present disclosure provides a method for full-chip quick simulation of negative tone development photolithography process, the method includes following steps:

S1, obtain light field distribution of photoresist based on an optical model, set the light field distribution to be E (x, y), and set acid concentration distribution in the photoresist as a function of the light field distribution, which is S(x, y)=F(E(x, y));

Negative development technology is a type of development technology with image inverted, which is opposite to traditional development technologies. By using special organic solvents for development, negative images can be obtained using traditional positive photoresists. Photoresist compositions used in this technology include resin and photoacid generator, in which the resin has acid unstable groups or acid cleavable organic groups. In the post exposure bake, exposed area is subjected to an action of acid generated by the light on the photoacid generator, causing the unstable groups or the acid cleavable groups in the resin to break to make the exposed area to be change from hydrophobicity to hydrophilicity, thereby reducing solubility of the exposed area in organic solvents. However, unexposed area still maintains its high solubility in the organic solvents, which allows them to be removed from the development solution made from the organic solvents during the development process. Therefore, contrary to dissolution of the exposed area during the development process of the traditional positive photoresist, this technology allows the unexposed area of the positive photoresist to be dissolved during development process, while the exposed area is retained.

Therefore, it can be known that distribution and a shape of the image after exposure are directly related to distribution of acid, which is directly related to distribution of the light field. Therefore, the distribution of acid concentration in photoresist can be set as a function of the distribution of light field. In a process of preparing a chip, quality of exposed image can be adjusted by adjusting parameters of the light field distribution.

Referring to FIG. 1 again, the method for full-chip quick simulation of negative tone development photolithography process further includes following step:

S2, set a thermal shrinkage effect of the photoresist in a post exposure process as an elastic deformation, and analyze the elastic deformation of the photoresist based on elastic mechanics, set one of the stress and strain variables as an equivalent of a deformation of the photoresist, to obtain an equivalent equation, which is a differential equation.

In this step, the photoresist can be a resin material containing high polymers, which has a certain degree of elasticity. Therefore, it can be considered as an elastic material with a certain degree of elasticity, and the thermal shrinkage effect of the photoresist in the post exposure bake process can be considered as elastic deformation. The elastic deformation of photoresist is analyzed based on elastic mechanics, and the light field distribution is adjusted according to a feedback of analysis results to obtain appropriate acid concentration distribution, so as to obtain an exposed image that meets composite requirements.

In the detailed analyzing process, one of the stress and strain variables is set as an equivalent of a deformation of the photoresist to obtain an equivalent equation.

Figure 2:
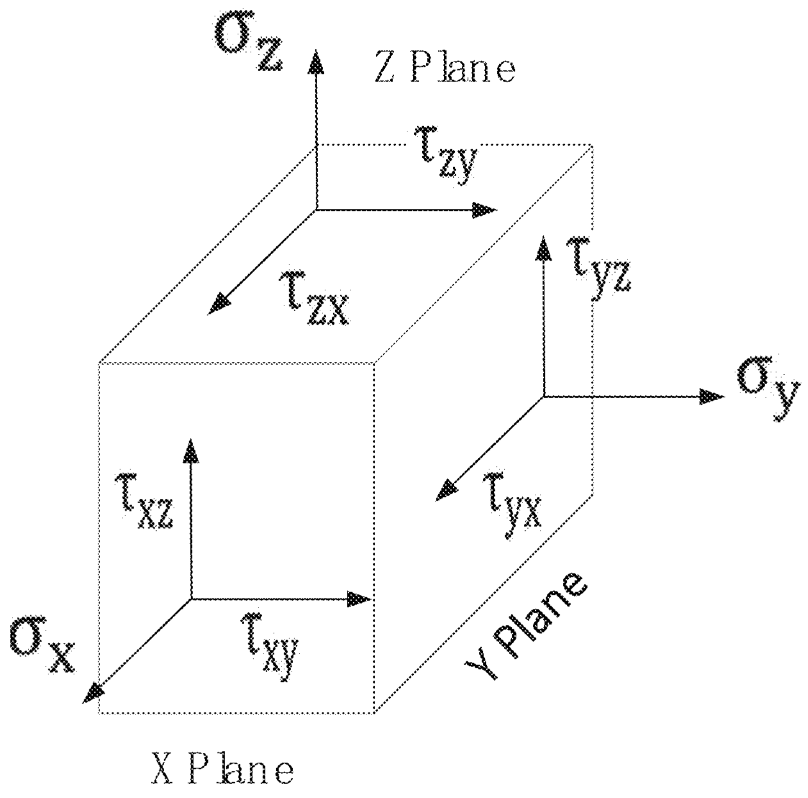
FIG. 2 is a schematic view of a differential unit corresponding to the photoresist.

Referring to FIG. 2, in the detailed analyzing process, the photoresist can be divided into several differential units. According to elastic mechanics analysis, each differential unit has three normal stresses $\sigma_x$, $\sigma_y$, $\sigma_z$, Six shear stresses $\tau_{xy}$, $\tau_{xz}$, $\tau_{yx}$, $\tau_{yz}$, $\tau_{zx}$, $\tau_{zy}$, where a direction of each normal stress is determined by the normal direction, the first subscript of each shear stress represents the action surface, and the second subscript represents the action direction. The symbols for normal stress and shear stress correspond to definitions of symbols in elastic mechanics textbooks. The indicators and symbols related to elasticity that appear below are also consistent with the definitions in the elasticity mechanics textbook, so there will be no further explanation here.

According to equivalent law of shearing stress, $\tau_{xy}=\tau_{yx}$, $\tau_{yz}=\tau_{zy}$, $\tau_{xz}=\tau_{zx}$.

Therefore, shear stress will no longer distinguish between which is the action surface and which is the action component, and the stress component can be obtained as follow:

$$\{\sigma\} = \begin{Bmatrix} \sigma_x \\ \sigma_y \\ \sigma_z \\ \tau_{xy} \\ \tau_{yz} \\ \tau_{zx} \end{Bmatrix}$$

Due to deformation of the differential unit, the differential unit may generate both normal and shear strains. The elongation and shortening of edges of each differential unit are normal strains, and change in the edges and angles is shear strain. Therefore, three normal strain components are obtained, $\varepsilon_x$, $\varepsilon_y$, $\epsilon_z$, three shear strain components, $\gamma_{xy}$, $\lambda_{yz}$, $\gamma_{zx}$, the strain component can be obtained as follows:

$$\{\varepsilon\} = \begin{Bmatrix} \varepsilon_x \\ \varepsilon_y \\ \varepsilon_z \\ \gamma_{xy} \\ \lambda_{yz} \\ \gamma_{zx} \end{Bmatrix}$$

The strain in elastic mechanics is usually called displacement. According to assumption of continuity, the differential unit, also known as an elastic body, remains a continuum before and after deformation. Assuming that a point in an elastic body moves from M(x, y, z) to M'(x', y', z') during deformation, this process is a continuous process, and all displacements satisfy the equation:

$$\{f\} = \begin{Bmatrix} u(x, y, z) \\ v(x, y, z) \\ w(x, y, z) \end{Bmatrix}$$

Wherein, u(x, y, z)=x'(x, y, z)−x, v(x, y, z)=y'(x, y, z)−y, w(x, y, z)=w'(x,y, z)−w. Wherein, u, v, w correspond to displacement on x direction, y direction and z direction, respectively. The photoresist can be considered as an elastic body.

Figure 3:
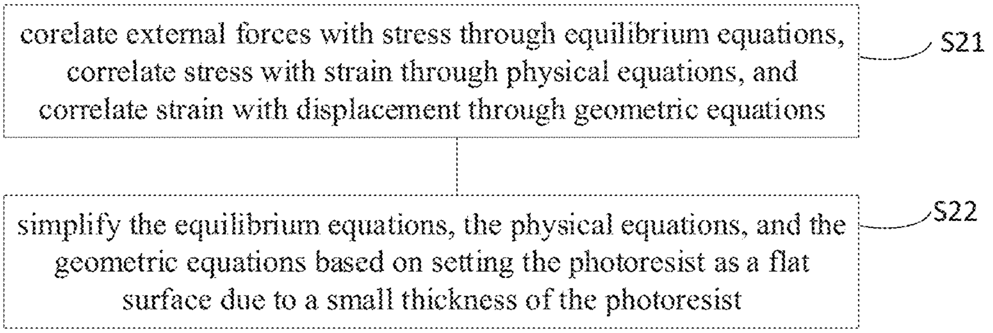
FIG. 3 is a detailed flow chart of step S2 in the method for full-chip quick simulation of negative tone development photolithography process according to the first embodiment of the present disclosure.

Referring to FIG. 3, in the step S2, the obtaining of the equivalent equation may include following steps:

S21, corelate external forces with stress through equilibrium equations, correlate stress with strain through physical equations, and correlate strain with displacement through geometric equations; and S22, simplify the equilibrium equations, the physical equations, and the geometric equations based on setting the photoresist as a flat surface due to a small thickness of the photoresist.

In step S21 above, in elasticity mechanics, external forces can be correlated with stress through the equilibrium equations, stress can be correlated with strain through the physical equations, and strain can be correlated with displacement through the geometric equations.

Wherein, the equilibrium equations are:

$$\frac{\partial\sigma_x}{x}+\frac{\partial\tau_{yx}}{y}+\frac{\partial\tau_{zx}}{z}+X=0$$

$$\frac{\partial\tau_{xy}}{x}+\frac{\partial\sigma_y}{y}+\frac{\partial\tau_{zy}}{z}+Y=0$$

$$\frac{\partial\tau_{xz}}{x}+\frac{\partial\tau_{yz}}{y}+\frac{\partial\sigma_z}{z}+Z=0$$

The physical equations are:

$$\varepsilon_x=\frac{1}{E}[\sigma_x-\mu(\sigma_y+\sigma_z)]$$

$$\varepsilon_y=\frac{1}{E}[\sigma_y-\mu(\sigma_z+\sigma_x)]$$

$$\varepsilon_z=\frac{1}{E}[\sigma_z-\mu(\sigma_x+\sigma_y)]$$

$$\gamma_{xy}=\frac{2(1+\mu)}{E}\tau_{xy}$$

$$\gamma_{yz}=\frac{2(1+\mu)}{E}\tau_{yz}$$

The geometric equations are:

$$\varepsilon_x=\frac{\partial u}{\partial x}$$

$$\varepsilon_y=\frac{\partial v}{\partial y}$$

$$\varepsilon_z=\frac{\partial w}{\partial z}$$

$$\gamma_{xy}=\frac{\partial v}{\partial x}+\frac{\partial u}{\partial y}$$

$$\gamma_{yz}=\frac{\partial w}{\partial y}+\frac{\partial v}{\partial z}$$

$$\gamma_{zx}=\frac{\partial u}{\partial z}+\frac{\partial w}{\partial x}$$

In step S22 above, since a thickness of the photoresist is relatively small, which is generally about 100 nm, it can be assumed that the photoresist is a flat surface, which can simplify the solving process and improve the computational speed.

When setting the photoresist to be a flat surface, $\sigma_z=0$, $\tau_{zx}=0$, $\tau_{zy}=0$, w=0, so the above equations will be simplified, and u, v are only functions of x, y. It can be inferred that the stress component is:

$$\{\sigma\}=\begin{Bmatrix}\sigma_x\\ \sigma_y\\ \tau_{xy}\end{Bmatrix}$$

The stain component is:

$$\{\varepsilon\}=\begin{Bmatrix}\varepsilon_x\\ \varepsilon_y\\ \gamma_{xy}\end{Bmatrix}$$

Both the equilibrium equations and the geometric equations are simplified.

Wherein, the equilibrium equations are simplified as follow:

$$\frac{\partial\sigma_x}{x}+\frac{\partial\tau_{yx}}{y}+X=0$$

$$\frac{\partial\tau_{xy}}{x}+\frac{\partial\sigma_y}{y}+Y=0$$

The geometric equations are simplified as follow:

$$\varepsilon_x=\frac{\partial u}{\partial x}$$

$$\varepsilon_y=\frac{\partial v}{\partial y}$$

$$\gamma_{xy}=\frac{\partial v}{\partial x}+\frac{\partial u}{\partial y}$$

Due to what is focused on is the elastic deformation of the photoresists, analysis of the elastic deformation can be used to adjust light field distribution and to adjust acid concentration distribution. In order to analyze the elastic deformation, one of stress or strain is chosen for analysis.

The following provides the analysis process for analyzing stress at first. After planarizing the photoresist, the strain component of a differential unit at a certain point is: $\varepsilon_x$ and $\varepsilon_y$. And the total strain ε is a superposition of the strain in the x direction and the y direction $\varepsilon_x$ and $\varepsilon_y$. That is, $$\varepsilon=\sqrt{\varepsilon_x^2+\varepsilon_y^2}.$$

According to simplified equations, the correlation formula between the strain and displacement of the differential unit can be obtained, which corresponds to the equivalent equation as follow:

$$\varepsilon=\sqrt{\varepsilon_x^2+\varepsilon_y^2}=\sqrt{\frac{\partial u^2}{\partial x}+\frac{\partial v^2}{\partial y}}.$$

In practical applications, displacement variables can be obtained by combining the exposed image data with parameters of the lithography machine.

In other embodiments, the equivalent equation can be obtained by forming correlations between stress and strain or other indicators, which will not be introduced more here.

Referring back to FIG. 1 again, the method for full-chip quick simulation of negative tone development photolithography process further includes following step:

S3, perform an approximate calculation of the equivalent equation using a Taylor expansion formula to obtain an approximate value of stress or strain, and adjust the light field distribution according to the approximate value to obtain an appropriate acid concentration distribution.

In this step, a simplified model obtained by simplifying the equations, which is known as the equivalent equation, requires consideration of speed. The process of solving the differential equations is not considered, which can avoid directly solving of the equivalent equation. Through observation, it is not difficult to find that the equivalent equation is very similar to the Taylor expansion. Therefore, the Taylor expansion is used to perform the approximate calculation to obtain the approximate value of stress or strain. According to the approximate value, the light field distribution is adjusted to obtain a suitable acid concentration distribution.

In this embodiment, the Taylor expansion formula provided is as follow:

$$S(x_0+h,\ y_0+k)$$

$$= S(x_0,\ y_0) + \left(h\frac{\partial}{\partial x} + k\frac{\partial}{\partial y}\right)S(x_0,\ y_0) + \frac{1}{2!}\left(h\frac{\partial}{\partial x} + k\frac{\partial}{\partial y}\right)S(x_0,\ y_0)^2 + \ldots + \frac{1}{n!}\left(h\frac{\partial}{\partial x} + k\frac{\partial}{\partial y}\right)^n S(x_0,\ y_0) + R_n$$

$$R_n = \frac{1}{(n+1)!}\left(h\frac{\partial}{\partial x} + k\frac{\partial}{\partial y}\right)^{n+1} S(x_0+\theta h,\ y_0+\theta k)$$

Wherein, $(0<\theta<1)$, h and k are constant.

The Taylor expansion formula provided in the present disclosure is only an exemplary embodiment, and can not limit the present disclosure. In other embodiment, other Taylor expansion formula can be used.

It should be noted that selecting sub terms of each order of the Taylor expansion to perform fitting calculation of the shrinkage effect, as sub terms of each order of the Taylor expansion are relatively simple, fast calculation can be achieved. For full-chip modeling, having a relatively concise backward propagation expression that can be represented can meet our requirements for speed while ensuring accuracy.

A second embodiment of the present disclosure provides a negative tone development photoresist model, which can be obtained through the method for full-chip quick simulation of negative tone development photolithography process provided by the first embodiment of the present disclosure.

Figure 4:
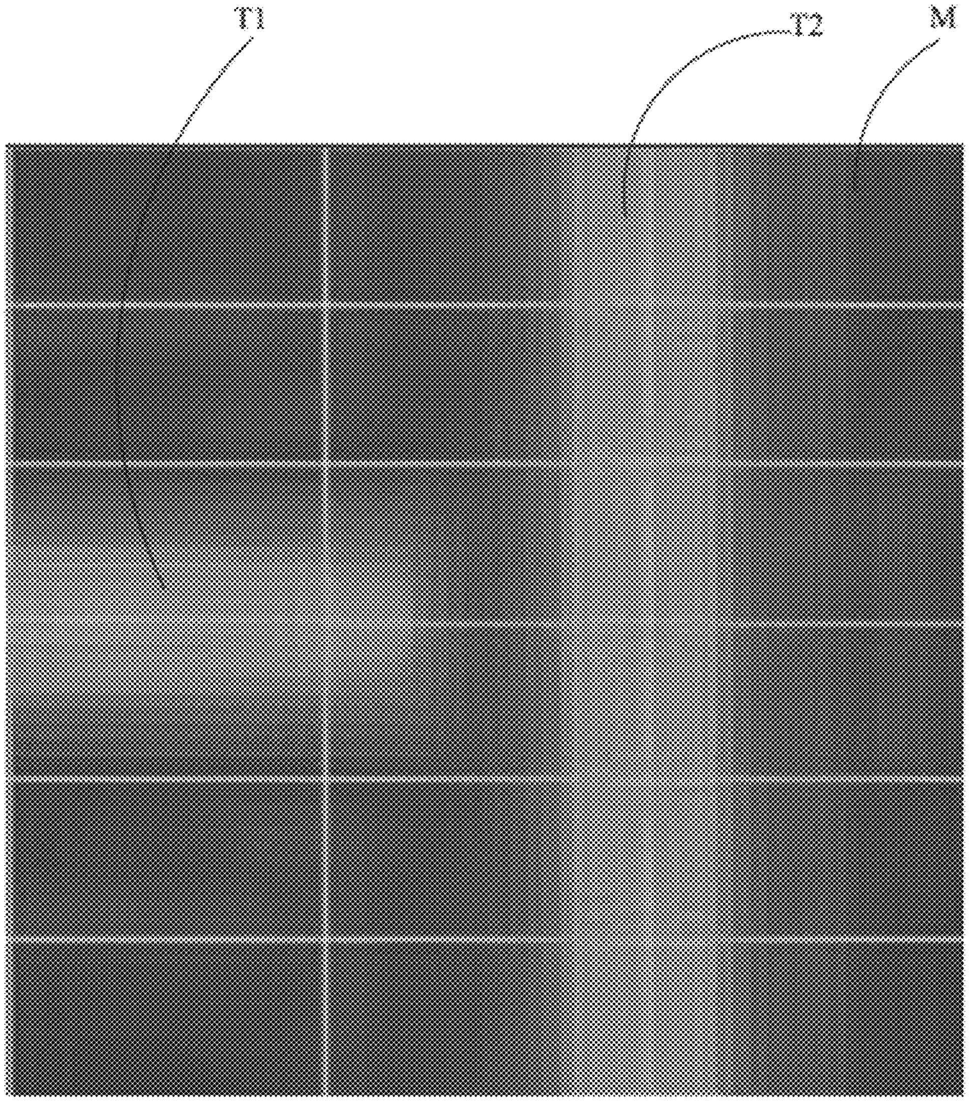
FIG. 4 is a schematic view of initial distribution of the light field in a negative tone development photoresist model according to a second embodiment of the present disclosure.
Figure 5:
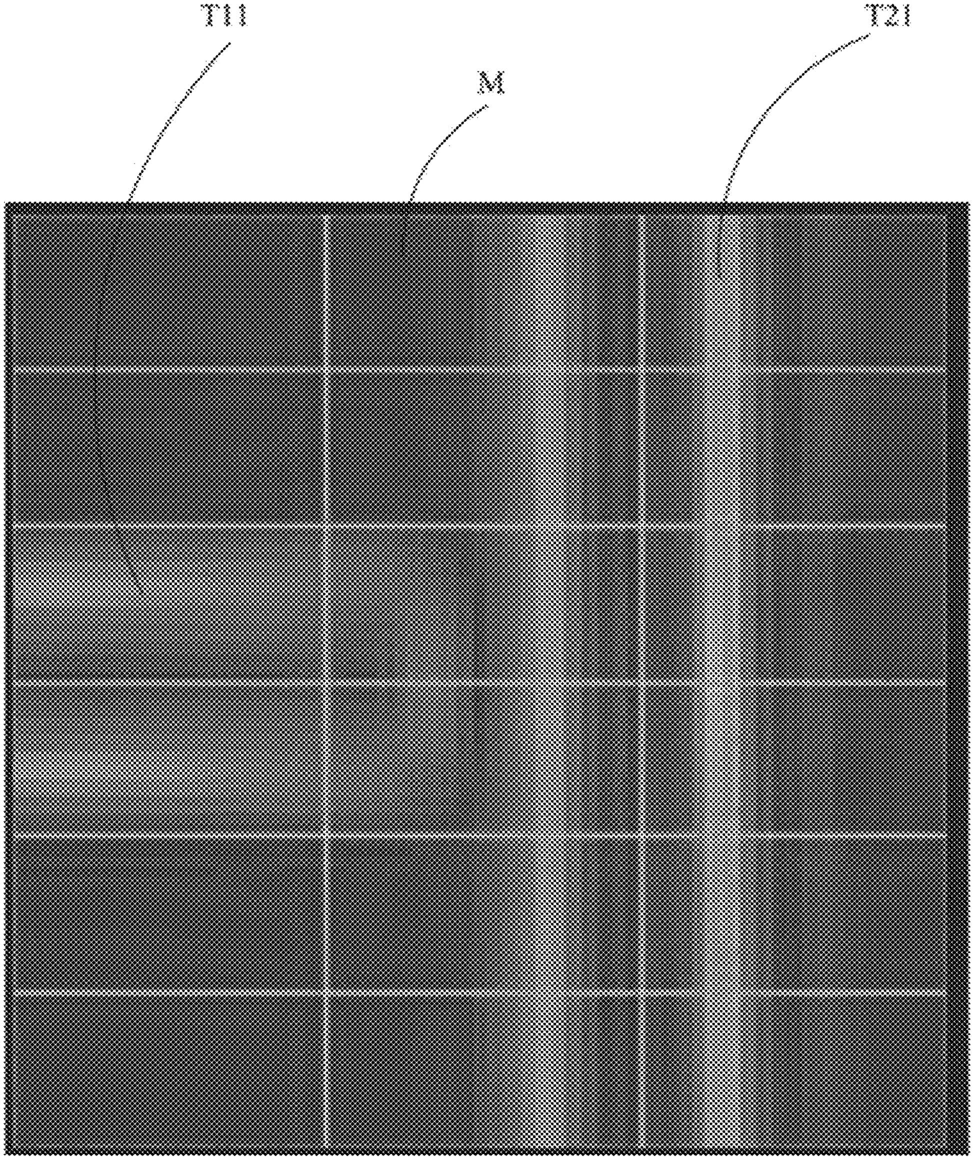
FIG. 5 is a schematic view of distribution of the light field optimized by the negative tone development photoresist model according to a second embodiment of the present disclosure.

Referring to FIGS. 4 and 5, in FIG. 4, a mask layout area is initially selected to generate a **512*512 mask image, corresponding to the M area of each grid in the figure. Then, through the optical model described in step S1, its light field distribution image is obtained, corresponding to the bright area in FIG. 4, T1 and T2, respectively. Furthermore, based on the operations in steps S2 and S3, the light field distribution is processed to obtain a simulated image after thermal shrinkage effect. During the adjustment process, multiple repeated adjustments are often required to obtain a suitable light field distribution and to obtain qualified exposed images. FIG. 5 corresponds to the image of the light field distribution when adjusted to achieve optimal light field distribution, where the brightness corresponds to T11 and T21. It can be clearly seen from the comparison between FIG. 5 and FIG. 4** that there is a significant squeezing effect towards the line segment at the endpoint, and there is a significant inward contraction at the corresponding positions of the long line segment and the endpoint.

A third embodiment of the present disclosure provides an OPC model, which includes an initial OPC model and the negative tone development photoresist model provided by the second embodiment. Generally, the initial OPC model includes a background light intensity distribution function, a light intensity gradient function, a light intensity curve function, a photo base distribution function, and a photoacid distribution function. After adding the negative tone development photoresist model mentioned above, it can adapt well to the negative photoresist process, simulate and calculate the thermal shrinkage effect of the negative photoresist, and improve accuracy of the lithography process.

Figure 6A:
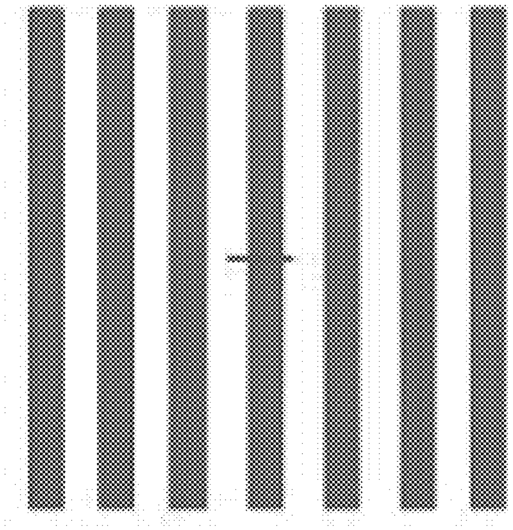
FIG. 6A is a schematic view of Group A measuring points used in OPC model fitting according to a third embodiment of the present disclosure.
Figure 6B:
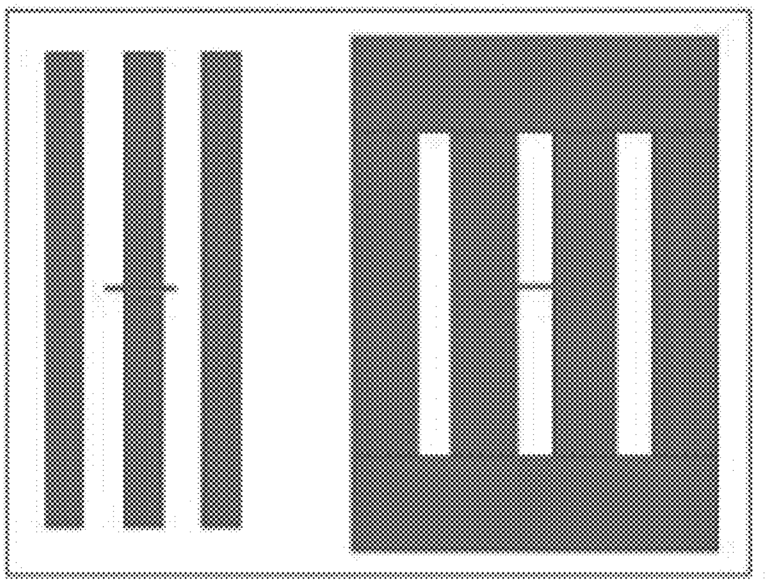
FIG. 6B is a schematic view of Group B measuring points used in OPC model fitting according to the third embodiment of the present disclosure.
Figure 6C:
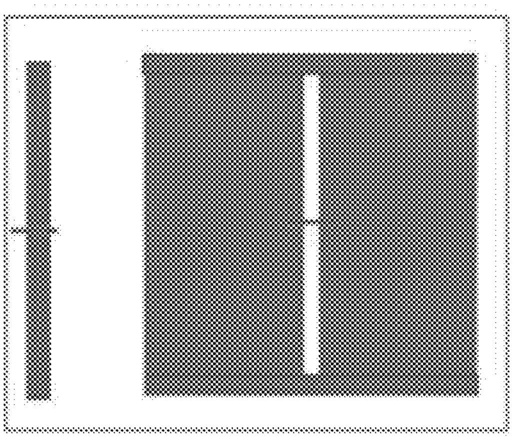
FIG. 6C is a schematic view of Group C measuring points used in OPC model fitting according to the third embodiment of the present disclosure.
Figure 6D:
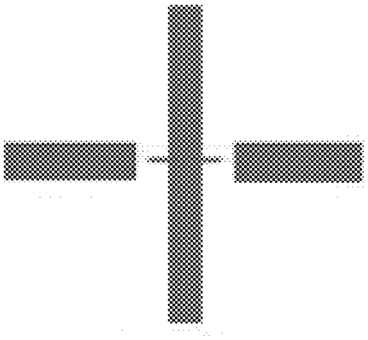
FIG. 6D is a schematic view of Group D measuring points used in OPC model fitting according to the third embodiment of the present disclosure.
Figure 6E:
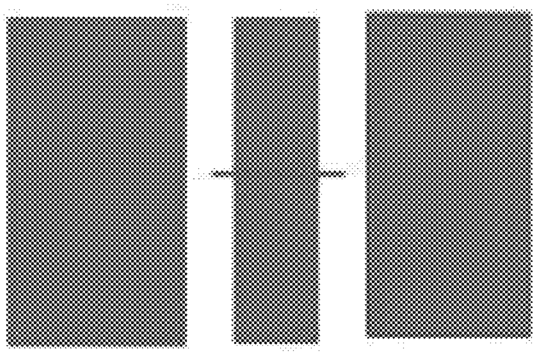
FIG. 6E is a schematic view of Group E measuring points used in OPC model fitting according to the third embodiment of the present disclosure.

Referring to FIGS. 6A-6E, 818 monitoring points (gauges) are provided to fit the obtained OPC model. Among them, there are 608 monitoring points under a one-dimensional mask as shown in FIGS. 6A-6C, named Group A, Group B, and Group C. There are 428 monitoring points in Group A, 94 monitoring points in Group B, and 86 monitoring points in Group C. It also includes 210 monitoring points under the two-dimensional mask shown in FIGS. 6D and 6E, named Group D and Group E respectively. There are 17 monitoring points in Group D, and 193 monitoring points in Group E. The root mean square of all monitoring points without model processing is (AI): 4.319 (RMS), after negative development model processing is (NTD): 1.289 (RMS), and after forward development model processing is (PTD): 2.025 (RMS).

The root mean square (RMS) corresponding to each group is (as shown in the table below):

| | RMS | | |
|---|---|---|---|
| Group | AI | PTD | NTD |
| All | 4.319 | 2.025 | 1.289 |
| group A | 4.114 | 1.064 | 1.021 |
| group B | 4.001 | 1.131 | 1.092 |
| group C | 4.795 | 1.704 | 1.299 |
| group D | 13.743 | 9.200 | 2.549 |
| group E | 2.622 | 2.443 | 1.681 |

Based on the above data, it can be seen that the root mean square value obtained by simulating the OPC model based on the negative photoresist model is relatively small, and the OPC model has better performance.

Figure 7:
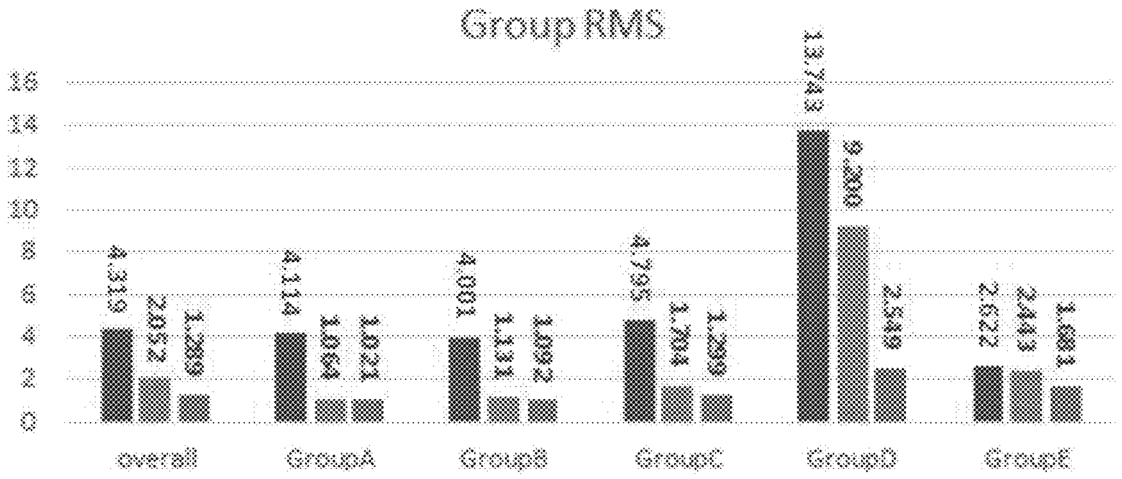
FIG. 7 is a bar chart illustrating root mean squares of Groups A-E measuring points used in OPC model fitting according to the third embodiment of the present disclosure.

Please refer to FIG. 7, which is a bar chart corresponding to the above table. From the bar chart, the obvious differences between the three can be more intuitively seen.

Figure 8:
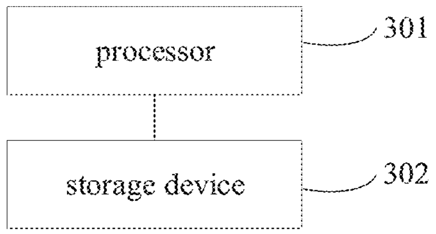
FIG. 8 is a block diagram of an electronic device according to a fourth embodiment of the present disclosure.

Referring to FIG. 8, a second embodiment of the present disclosure provides an electronic device 300, which includes one or more processors 301;

A storage device 302 configured to store one or more programs;

When the one or more programs are executed by the one or more processors 301, the one or more processors 301 are caused to perform the method for full-chip quick simulation of negative tone development photolithography process provided by the first embodiment.

Figure 9:
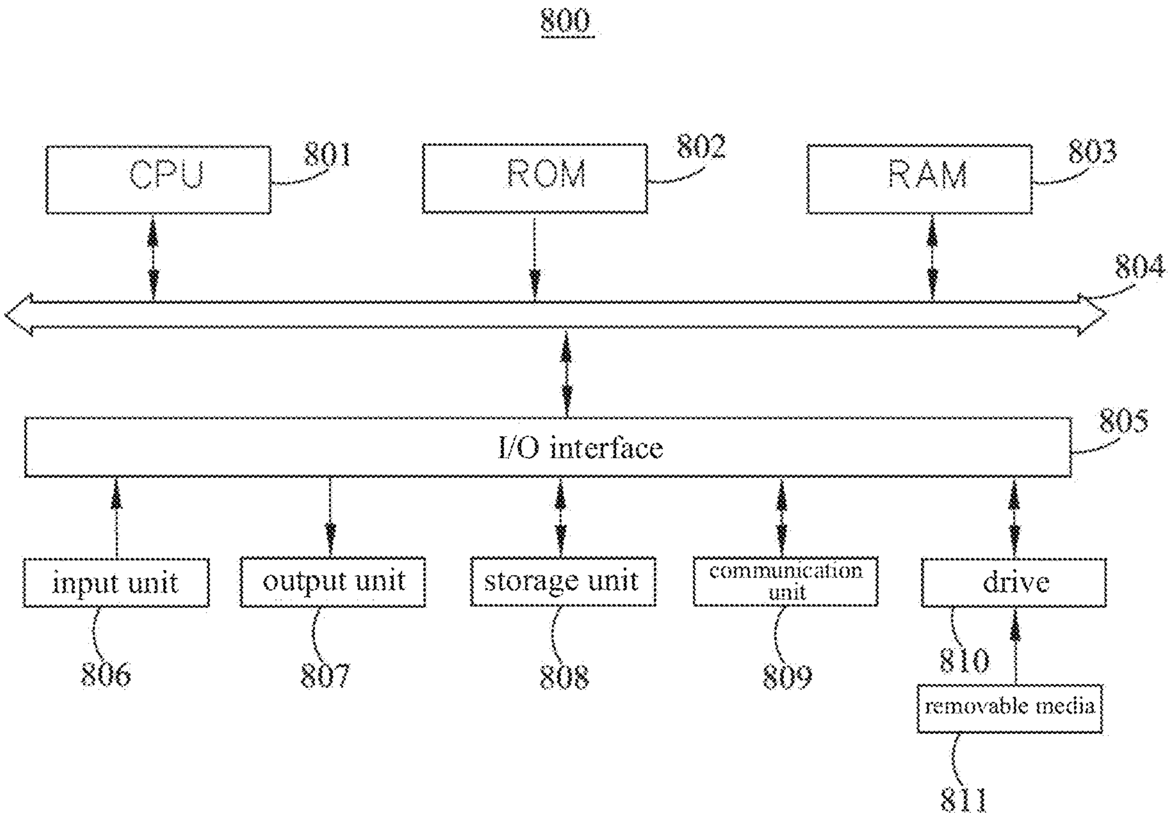
FIG. 9 is a schematic view of a computer system for implementing the present disclosure.

Referring to FIG. 9, a structural diagram of a computing system 800 for implementing a terminal device/server (eg. the electronic device 300) is illustrated. The terminal device/server shown in FIG. 9 is only an example and should not impose any limitations on functionality and scope of use of the present disclosure.

Referring to FIG. 9, the computing system 800 includes a central processing unit (CPU) 801, which can perform various appropriate actions and processing based on programs stored in a read-only memory (ROM) 802 or programs loaded from a storage unit 808 into a random access memory (RAM) 803. In the RAM 803, various programs and data required for operations of the system 800 are also stored. The CPU 801, the ROM 802, and the RAM 803 are connected to each other through a bus 804. An input/output (I/O) interface 805 is also connected to the bus 804.

The following components are connected to the I/O interface 805: an input unit 806 including a keyboard, a mouse, and etc.; an output unit 807 including a cathode ray tube (CRT), a liquid crystal display (LCD), a speaker, and etc.; a storage unit 808 including a hard disk, and etc.; and a communication unit 809 including network interface cards such as LAN cards, modems, etc. The communication unit 809 performs communication processing through a network such as the Internet. A drive 810 is also connected to the I/O interface 805 as needed. A removable media 811, such as magnetic disks, optical disks, magneto-optical disks, semiconductor memory, etc., are installed on the drive 810 as needed to facilitate installation of computer programs read from it into the storage unit 808 as needed.

According to the embodiments of the present disclosure, the processes described in above methods may be implemented as a computer software program. For example, embodiments of the present disclosure include a computer program product that includes a computer program carried on a computer-readable medium. The computer program includes program codes for executing a method shown in a flow chart. In such an embodiment, the computer program may be downloaded and installed from the network through a communication unit 809, and/or installed from a removable medium 811. When the computer program is executed by the central processing unit (CPU) 801, the above functions defined in the methods of the present disclosure are executed. It should be noted that the computer-readable medium described in the present disclosure can be a computer-readable signal medium or a computer-readable storage medium or any combination of the two. Computer readable storage medium can include, but is not limited to, systems, devices or components including, but not limited to, electrical, magnetic, optical, electromagnetic, infrared, or semiconductor, or any combination of the above. More detailed examples of computer-readable storage medium may include, but are not limited to, an electrical connection with one or more wires, a portable computer disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device or any suitable combination of the above.

The computer program codes for performing the operations of the present disclosure can be written in one or more programming languages or a combination thereof. The programming languages include object-oriented programming languages such as Java, Smalltalk, C++, and conventional procedural programming languages such as "C" or similar programming languages. The program codes can be completely executed on a user's computer, partially executed on the user's computer, executed as an independent software package, partially executed on the user's computer, partially executed on a remote computer, or completely executed on the remote computer or a server. In the case involving a remote computer, the remote computer may be connected to the user computer through any kind of networks, including a local area network (LAN) or a wide area network (WAN), or may be connected to an external computer (e.g., through the Internet using an Internet service provider).

The flow charts and module diagrams in the attached drawings illustrate possible architectures, functions and operations of systems, methods and computer program products according to various embodiments of the present application. In this regard, each block in a flow chart or a block diagram may represent a module, program segment, or part of code that contains one or more executable instructions for implementing a specified logical function. It should also be noted that in some alternative embodiments, functions identified in the blocks may also occur in a different order than those shown in the drawings. For example, two blocks represented successively can actually be executed basically in parallel, and they can sometimes be executed in an opposite order, depending on functions involved. It should also be noted that each block in the block diagram and/or a flow chart and the combination of blocks in the block diagram and/or the flow chart can be realized by a dedicated hardware based system performing specified functions or operations, or by a combination of dedicated hardware and computer instructions.

The above computer readable medium stores one or more programs, when the one or more programs are executed by the device, the device is caused to perform: obtain light field distribution of photoresist based on an optical model, set the light field distribution to be E (x, y), and set acid concentration distribution in the photoresist as a function of the light field distribution, which is S(x, y)=F(E(x, y)); set a thermal shrinkage effect of the photoresist in a post exposure process as an elastic deformation, analyze the elastic deformation of the photoresist based on elastic mechanics, wherein one of the stress and strain variables is set as an equivalent of a deformation of the photoresist, to obtain an equivalent equation, which is a differential equation; perform an approximate calculation of the equivalent equation using a Taylor expansion formula to obtain an approximate value of stress or strain, and adjust the light field distribution according to the approximate value to obtain an appropriate acid concentration distribution.

The above description are only embodiments of the present disclosure, and is not intended to limit the present disclosure. Any modifications, equivalent substitutions, improvements, etc. made within the spirit and scope of the present disclosure are intended to be included within the scope of the present disclosure.

What is claimed is:

1. A method for full-chip quick simulation of negative tone development photolithography process, comprising following steps:

S1, obtaining light field distribution of photoresist based on an optical model, setting the light field distribution to be E(x, y), and setting acid concentration distribution in the photoresist as a function of the light field distribution, which is S(x, y)=F (E(x,y));

S2, setting a thermal shrinkage effect of the photoresist in a post exposure process as an elastic deformation, and analyzing the elastic deformation of the photoresist based on elastic mechanics, setting one of the stress and strain variables as an equivalent of a deformation of the photoresist, to obtain an equivalent equation, which is a differential equation; and S3, performing an approximate calculation of the equivalent equation using a Taylor expansion formula to obtain an approximate value of stress or strain, and adjusting the light field distribution according to the approximate value to obtain an appropriate acid concentration distribution, and obtaining an exposed image that meets composite requirements.

2. The method for full-chip quick simulation of negative tone development photolithography process according to claim 1, wherein according to assumption of continuity, an elastic body remains continuous before and after deformation, assuming that a point in an elastic body moves from M(x, y, z) to M'(x', y', z') during deformation, this process is a continuous process, and all displacements satisfy the equation:

$$\{f\} = \begin{Bmatrix} u(x, y, z) \\ v(x, y, z) \\ w(x, y, z) \end{Bmatrix}$$

wherein, u(x, y, z)=x'(x, y, z)−x, v (x, y, z)=y'(x, y, z)−y, w(x, y, z)=w'(x, y, z)−w, wherein, u, v, w correspond to displacement on x direction, y direction and z direction, respectively, the photoresist is considered as an elastic body, in step S2, obtaining of the equivalent equation comprises following steps:

S21, corelating external forces with stress through equilibrium equations, correlating stress with strain through physical equations, and correlating strain with displacement through geometric equations; and S22, simplifying the equilibrium equations, the physical equations, and the geometric equations based on setting the photoresist as a flat surface due to a small thickness of the photoresist.

3. The method for full-chip quick simulation of negative tone development photolithography process according to claim 2, wherein the equivalent equation corresponding to a correlation formula between the strain and the displacement is obtained based on simplified geometric equations.

4. The method for full-chip quick simulation of negative tone development photolithography process according to claim 3, wherein the symbols in following equations are consistent with definition in elastic mechanics;

in step S22, the photoresist is considered to be a flat surface, $\sigma_z=0$, $\tau_{zx}=0$, $\tau_{zy}=0$, w=0; the stress component is:

$$\{\sigma\} = \begin{Bmatrix} \sigma_x \\ \sigma_y \\ \tau_{xy} \end{Bmatrix}$$

the stain component is:

$$\{\varepsilon\} = \begin{Bmatrix} \varepsilon_x \\ \varepsilon_y \\ \gamma_{xy} \end{Bmatrix}$$

the equilibrium equations are simplified as follow:

$$\frac{\partial \sigma_x}{x} + \frac{\partial \tau_{yx}}{y} + X = 0$$

$$\frac{\partial \tau_{xy}}{x} + \frac{\partial \sigma_y}{y} + Y = 0$$

the geometric equations are simplified as follow:

$$\varepsilon_x = \frac{\partial u}{\partial x}$$

$$\varepsilon_y = \frac{\partial v}{\partial y}$$

$$\gamma_{xy} = \frac{\partial v}{\partial x} + \frac{\partial u}{\partial y}.$$

5. The method for full-chip quick simulation of negative tone development photolithography process according to claim 4, wherein the equivalent equation is:

$$\varepsilon = \sqrt{\varepsilon_x^2 + \varepsilon_y^2} = \sqrt{\frac{\partial u^2}{\partial x} + \frac{\partial v^2}{\partial y}}.$$

6. The method for full-chip quick simulation of negative tone development photolithography process according to claim 5, wherein, a Taylor expansion formula similar with the equivalent equation is:

$$\begin{aligned} &S(x_0 + h, y_0 + k) \\ &= S(x_0, y_0) + \left(h\frac{\partial}{\partial x} + k\frac{\partial}{\partial y}\right)S(x_0, y_0) + \\ &\quad \frac{1}{2!}\left(h\frac{\partial}{\partial x} + k\frac{\partial}{\partial y}\right)S(x_0, y_0)^2 + \dots + \frac{1}{n!}\left(h\frac{\partial}{\partial x} + k\frac{\partial}{\partial y}\right)^n S(x_0, y_0) + R_n \\ &R_n = \frac{1}{(n+1)!}\left(h\frac{\partial}{\partial x} + k\frac{\partial}{\partial y}\right)^{n+1} S(x_0 + \theta h, y_0 + \theta k) \end{aligned}$$

wherein, $(0<\theta<1)$, h and k are constant.

7. A negative tone development photoresist model, wherein the negative tone development photoresist model is obtained by the method for full-chip quick simulation of negative tone development photolithography process of claim 1.

8. An electronic device, comprising:

one or more processors;

a storage device, configured to store one or more programs;

when the one or more programs are executed by the one or more processors, the one or more processors are caused to perform the method for full-chip quick simulation of negative tone development photolithography process of claim 1.

* * * * *